(12) United States Patent
Youngner (10) Patent No.: US 9,548,191 B2
(45) Date of Patent: Jan. 17, 2017

(54) ION TRAPPING WITH INTEGRATED ELECTROMAGNETS

(71) Applicant: Honeywell International Inc., Morristown, NJ (US)

(72) Inventor: Daniel Youngner, Maple Grove, MN (US)

(73) Assignee: Honeywell International Inc., Morris Plains, NJ (US)

( * ) Notice: Subject to any disclaimer, the term of this patent is extended or adjusted under 35 U.S.C. 154(b) by 0 days.

(21) Appl. No.: 14/742,346

(22) Filed: Jun. 17, 2015

(65) Prior Publication Data
US 2016/0372314 A1    Dec. 22, 2016

(51) Int. Cl.
*H01J 49/06*    (2006.01)
(52) U.S. Cl.
CPC ..................... *H01J 49/06* (2013.01)
(58) Field of Classification Search
USPC ........................ 250/281, 282, 283
See application file for complete search history.

(56) References Cited

U.S. PATENT DOCUMENTS

2011/0170647 A1* 7/2011 Bussard ............... G21B 1/05
376/129

OTHER PUBLICATIONS

Kunert, et al. "A planar ion trap chip with integrated structures for an adjustable magnetic field gradient", Applied Physics B: Lasers and Optics, vol. 114, No. 1-2, Dec. 1, 2013, 10 pp.
Welzel, et al., "Designing spin-spin interactions with one and two dimensional ion crystals in planar micro traps", The European Physical Journal D: Atomic, Molecular, and Optical Physics, Societa Italiana Di Fisica, vol. 65, No. 1-2, Jul. 27, 2011, 13 pp.
Antaya, et al., "The superconducting electron cyclotron resonance 6.4 GHz high-B mode and frequency scaling in electron cyclotron resonance ion sources", Review of Scientific Intruments, vol. 65, No. 5, May 1, 1994, 6 pp.
Extended Search Report from related European Patent Application EP 16164338, dated Nov. 3, 2016, 9 pp.

* cited by examiner

*Primary Examiner* — Nicole Ippolito
(74) *Attorney, Agent, or Firm* — Brooks, Cameron & Huebsch, PLLC (57) ABSTRACT

Devices, systems, and methods for ion trapping with integrated electromagnets are described herein. One device includes a plurality of electrodes configured to trap an ion above a surface of the device, a medial coil and a plurality of peripheral coils, each positioned at a respective radial angle associated with the medial coil, wherein the medial coil is configured to generate a first magnetic field having a first orientation, and wherein the peripheral coils are configured to generate a second magnetic field having a second orientation that opposes the first orientation.

20 Claims, 6 Drawing Sheets

ION TRAPPING WITH INTEGRATED ELECTROMAGNETS

STATEMENT OF GOVERNMENT RIGHTS

This invention was made with Government support under contract: W911NF-12-1-0605, awarded by the U.S. Army. The Government has certain rights in this invention.

TECHNICAL FIELD

The present disclosure relates to devices, systems, and methods for ion trapping with integrated electromagnets.

BACKGROUND

An ion trap can use a combination of electrical and magnetic fields to capture one or more ions in a potential well. Ions can be trapped for a number of purposes, which may include mass spectrometry, research, and/or controlling quantum states, for example.

Previous approaches to ion trapping may include magnets that are distanced from a surface of the trap, for instance. Because the behavior of ions in a trap can be a sensitive function of the local magnetic field around the ion(s), previous approaches may lack precision. In some instances, local variations in the magnetic field may exist in a region where uniformity is desired. In other instances, uniformity of the magnetic field may be present where local variations are desired.

DETAILED DESCRIPTION

Devices, methods, and systems for ion trapping with integrated electromagnets are described herein. For example, one or more embodiments include a plurality of electrodes configured to trap an ion above a surface of the device, a medial coil and a plurality of peripheral coils, each positioned at a respective radial angle associated with the medial coil, wherein the medial coil is configured to generate a first magnetic field having a first orientation, and wherein the peripheral coils are configured to generate a second magnetic field having a second orientation that opposes the first orientation.

Ions can be trapped in accordance with one or more embodiments of the present disclosure through the use of coils (e.g., "microcoils") in metal layers below the surface of an ion trap. Electric currents can be run through the coils to control their operation. In some embodiments the currents used may be as small as a few nanoamps; the coils may be as small as a few microns in diameter.

In some embodiments, other, larger coils (Helmholtz coils) can be used to create a region of substantially uniform magnetic field. The Helmholtz coils can allow for the creation of a nearly-uniform magnetic field across the entire surface (e.g., top surface) of the ion trap. In some embodiments, other coils (e.g., "trim coils"), which may be smaller than the Helmholtz coils, can be used to compensate for magnetic field falloff near the edge(s) of the ion trap.

By using coils below the surface of an ion trap, embodiments of the present disclosure can provide enhanced ion trapping precision with respect to previous approaches. The coils can allow the creation of a uniform field in certain areas where desired and/or the creation of a varied field in certain areas where desired. As a result, ion trapping in accordance with one or more embodiments of the present disclosure can allow more precise control of trapped ion(s) and thereby enhance logical functions, such as the flipping of ionic spin associated with an ion, for instance, among others.

In the following detailed description, reference is made to the accompanying drawings that form a part hereof. The drawings show by way of illustration how one or more embodiments of the disclosure may be practiced.

These embodiments are described in sufficient detail to enable those of ordinary skill in the art to practice one or more embodiments of this disclosure. It is to be understood that other embodiments may be utilized and that process changes may be made without departing from the scope of the present disclosure.

As will be appreciated, elements shown in the various embodiments herein can be added, exchanged, combined, and/or eliminated so as to provide a number of additional embodiments of the present disclosure. The proportion and the relative scale of the elements provided in the figures are intended to illustrate the embodiments of the present disclosure, and should not be taken in a limiting sense.

The figures herein follow a numbering convention in which the first digit or digits correspond to the drawing figure number and the remaining digits identify an element or component in the drawing. Similar elements or components between different figures may be identified by the use of similar digits.

Figure 1:
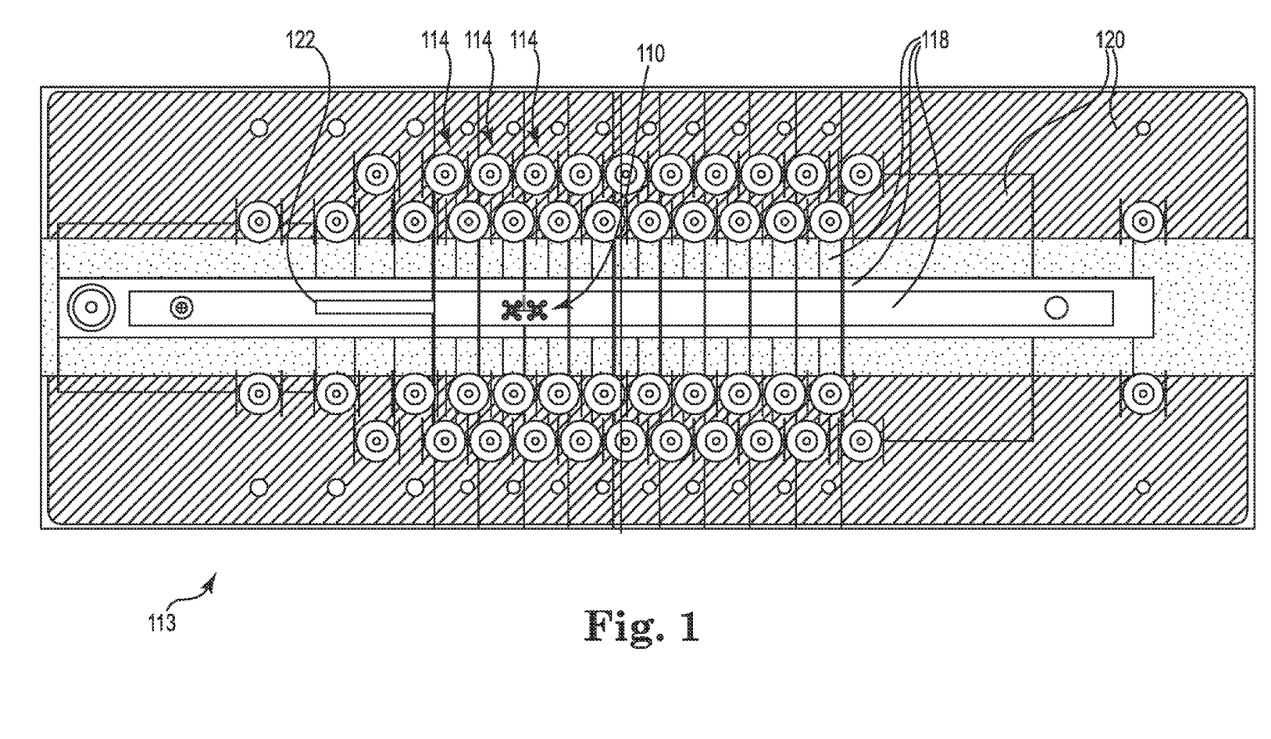
FIG. 1 illustrates a top view of an ion trap for trapping ions with integrated electromagnets in accordance with one or more embodiments of the present disclosure.

FIG. 1 illustrates a top view of an ion trap 313 for trapping ions with integrated electromagnets in accordance with one or more embodiments of the present disclosure. In some embodiments, the ion trap 113 can be approximately 3200 microns by 1120 microns. The ion trap 113 can include a plurality of conductive materials. For instance, the ion trap 113 can include a second conductive material 118, and a third conductive material 120. The ion trap 113 can include a first conductive material, for instance, not shown in the example illustrated in FIG. 1, but shown in FIGS. 3 and/or 6 herein. In some embodiments, the first conductive material can form a ground plane (e.g., including a plurality of grounded electrodes); the second conductive material 118 can form a signal routing plane and/or RF lines (e.g., including a plurality of RF electrodes), and the third conductive material 120 can form a ground connection and/or DC electrode rail plane (e.g., including a plurality of grounded electrodes and/or DC electrodes).

As shown in FIG. 1, the ion trap 113 includes a plurality of DC electrodes 114 for ion trapping. The electrodes 114 can each be analogous to the electrodes 414 discussed below in connection with FIG. 4, for instance. Each of the devices 114 can include a through-silicon via (TSV) and a trench capacitor. While some portion of the devices 114 would otherwise be underneath, and thus obscured by, the third conductive material 120, the devices 114 are shown in FIG. 1 for purposes of illustration.

It is noted that the positioning and/or layout of the devices 114 shown in FIG. 1 is not to be taken in a limiting sense; that is, embodiments of the present disclosure are not limited to the positioning and/or layout of the devices 114 shown in FIG. 1. The ion trap 113 can be bonded to an interposer, for instance. In some embodiments, the interposer can be approximately 1 centimeter by 1 centimeter.

One or more ions can pass from a bottom of the ion trap 113 to a top of the ion trap 113 through an atom loading slot 122. The loading slot 122 can be located on the ground plane of the ion trap 113, for instance, and can be substantially centered on a longitudinal axis of the ion trap 113. Once an ion passes above the top surface of the ground plane, the ion can be trapped in a potential well using electrical and/or magnetic fields created by the devices 114. The electrical and/or magnetic fields can be controlled by one or more connected devices (e.g., a controller and/or computing device) via one or more bonds to an interposer.

As shown in FIG. 1, the ion trap 113 includes an electromagnet system 110. The system 110 can be analogous to the system 310, discussed below in connection with FIG. 3, for instance. As shown, the system 110 can be substantially centered on a longitudinal axis of the ion trap 113. The system 110 can be integrated (e.g., embedded in the second conductive material 118. That is, the second layer portion of the system 110 (illustrated in part in FIG. 2C) can be included in the second conductive material 118 layer. The first layer portion of the system 110 (illustrated in part in FIG. 2B) can be included in the first conductive material layer (not shown in FIG. 1) below the second conductive material 418. One or more vias can extend from the first conductive material to the second conductive material 118, connecting the first layer portion and the second layer portion.

Figure 2A:
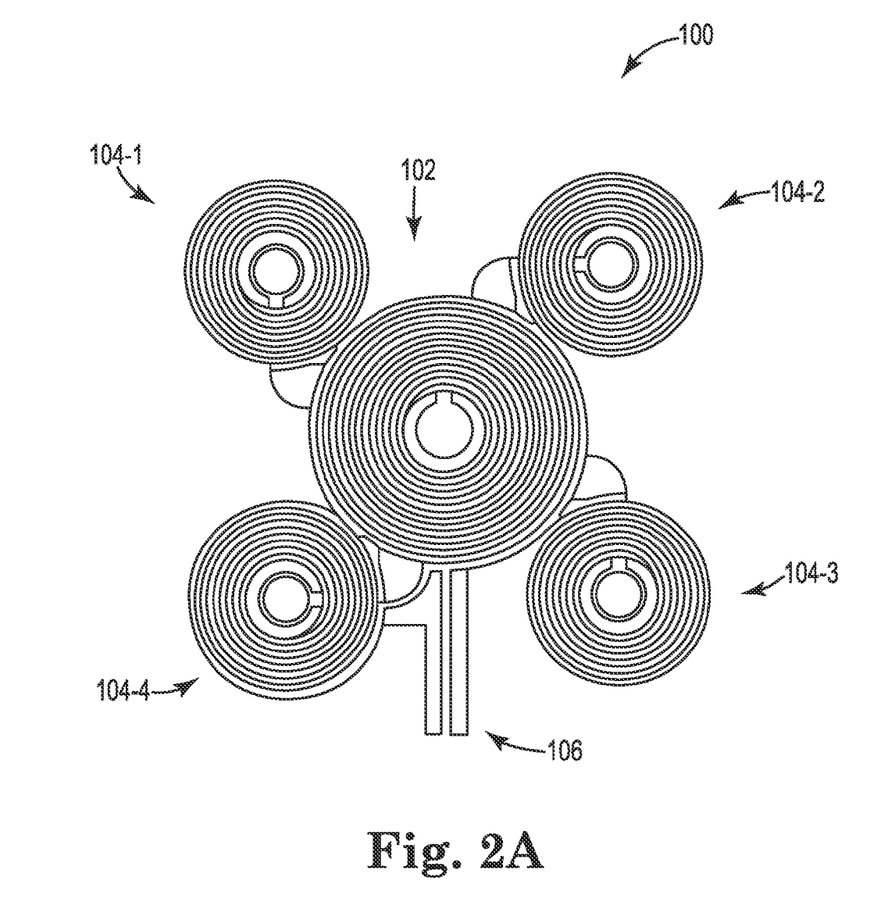
FIGS. 2A-2D illustrate top views of various portions of electromagnets that can be integrated into an ion trap for trapping ions with integrated electromagnets in accordance with one or more embodiments of the present disclosure.
Figure 2B:
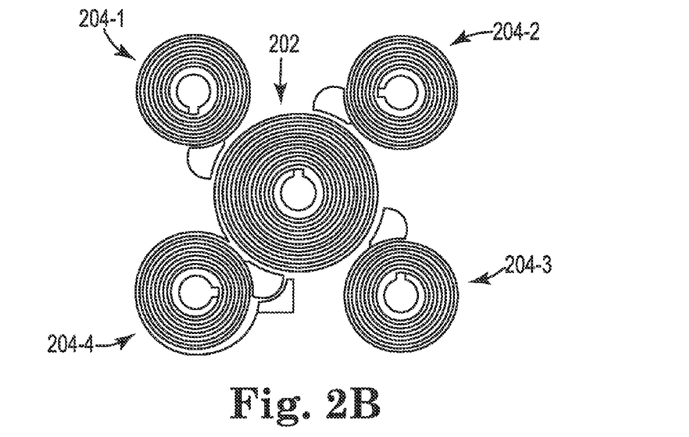
Figure 2C:
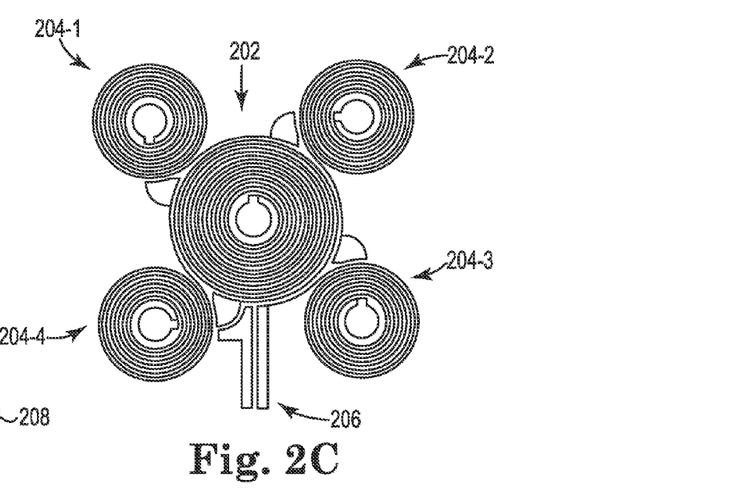
Figure 2D:
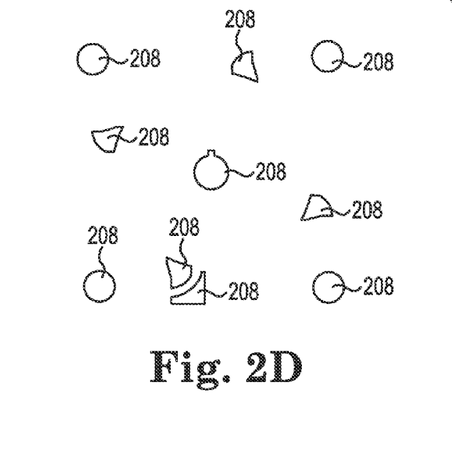

FIGS. 2A-2D illustrate top views of various portions of electromagnets that can be integrated into an ion trap for trapping ions with integrated electromagnets in accordance with one or more embodiments of the present disclosure. For instance, the device 200 illustrated in FIG. 2A includes each of the aspects of the device 200 that are illustrated in FIGS. 2B, 2C, and 2D. FIG. 2A illustrates a device 200 for ion trapping in accordance with one or more embodiments of the present disclosure. FIG. 2B illustrates a first layer portion of the device 200 illustrated in FIG. 2A. FIG. 2C illustrates a second layer portion of the device 200 illustrated in FIG. 2A. FIG. 2D illustrates a plurality of vias of the device 200 illustrated in FIG. 2A.

The device 200 can include a medial coil 202 and a plurality of peripheral coils. As shown in FIGS. 2A, 2B, and 2C, the device 200 can include a first peripheral coil 204-1, a second peripheral coil 204-2, a third peripheral coil 204-3, and a fourth peripheral coil 204-4 (sometimes cumulatively referred to as "peripheral coils 204"). It is noted that although four peripheral coils are illustrated in FIGS. 2A, 2B, and 2C, embodiments of the present disclosure are not so limited; more or fewer peripheral coils 204 can be included in ion trapping devices in accordance herewith.

As shown, each of the peripheral coils 204 can be positioned at a respective radial angle associated with the medial coil 202. For instance, the first peripheral coil 204-1 is shown as being positioned at a radial angle that opposes that of the third peripheral coil 204-3. Similarly, the second peripheral coil 204-2 is shown as being positioned at a radial angle that opposes that of the fourth peripheral coil 204-4. The peripheral coils 204 (e.g., a center and/or an edge of the peripheral coils 204) can be equally distanced from one another; that is, one of the peripheral coils 204 can be equally distanced from each of its adjacent peripheral coils 204. For example, the first peripheral coil 204-1 can be equidistant from the second peripheral coil 202-2 and the fourth peripheral coil 204-4. The peripheral coils 204 can be equally distanced from the medial coil 202. In effect, the peripheral coils 204 can be positioned to surround the medial coil 202.

The device 200 can include an input/output (I/O) portion 206. The I/O portion 206 can connect one or more portions of the device 200 to one or more current sources (or other device(s)), for instance. In some embodiments, the I/O portion 206 can connect the device 200 to a controller and/or computing device, for instance, configured to control one or more operations of the device 200.

As shown in FIGS. 2B and 2C, the device 200 can include a first layer portion and a second layer portion, respectively. The first layer portion can be disposed in a first layer of an ion trap and the second layer portion can be disposed in a second layer of an ion trap (discussed further below), for instance. It is noted that both the first layer portion and the second layer portion of the device 200 are illustrated in FIG. 2A. As shown in FIG. 2D, though not labeled in FIGS. 2A, 2B, and/or 2C so as not to obscure embodiments of the present disclosure, the device 200 can include a plurality of vias 208. Each of the vias 208 can connect an aspect of the first layer portion of the device 200 and an aspect of the second layer portion of the device 200.

The medial coil 202 and/or the peripheral coils 204 can be composed of metal wire, such as copper and/or gold, for instance. In some embodiments, the medial coil 202 and/or the peripheral coils 204 can be composed of multi-layer stacks of niobium and copper. In such cases, each wire can be constructed of alternating layers of copper (e.g., 100 nanometers thick) and niobium (e.g., 100 nanometers thick). For example, if 11 such layers were used, the wire would exhibit a thickness of approximately 1.1 microns. It is noted that the listing of these materials is not to be taken in a limiting sense; additional or alternative materials can be used and are in accordance with embodiments of the present disclosure.

In some embodiments, each wire can be approximately 0.7 microns thick (e.g., 0.68 to 0.72 microns thick). In some embodiments, a portion of a wire included in the medial coil 202 and/or the peripheral coils 204 can be separated from an adjacent portion (e.g., winding) by approximately 0.7 microns (e.g., 0.68 to 0.72 microns), rendering a pitch of approximately 1.4 microns. In some embodiments, the medial coil 202 and/or the peripheral coils 204 can have a radius between 15 and 50 microns and can contain between 60 and 70 windings.

In accordance with one or more embodiments of the present disclosure, the medial coil 202 can be configured to generate a first magnetic field. Several tens of milliamps can flow through the medial coil 202 (e.g., from the I/O portion 206), creating a magnetic field of up to 0.02 T, with field gradients of up to 20 T/m.

In accordance with one or more embodiments of the present disclosure, the peripheral coils can be configured to generate a second magnetic field. Several tens of milliamps can flow through the each of the peripheral coils 204 (e.g., from the I/O portion 206), creating a magnetic field of up to 0.02 T, with field gradients of up to 20 T/m.

The first magnetic field (generated by the medial coil 202) and the second magnetic field (generated by the peripheral coils 204) can have different orientations. That is, the first magnetic field can have a first orientation (e.g., "up"), and the second magnetic field can have a second orientation (e.g., "down") that opposes the first orientation.

The magnetic fields created by the medial coil 202 and the peripheral coils 204 can exhibit zero far-field dipole, quadrupole, and/or octupole signatures. That is, the net magnetic field generated through the use of all five coils rapidly approaches 0T over distance. In some embodiments, the net field can be less than 1E-6 T at a distance of 300 microns from the center of the medial coil 202, and can be less than 1E-7 T at a distance of 510 microns from the center of the medial coil 202. Because the opposing fields generated by the medial coil 102 and the sum of the four peripheral coils 204 are comparable in magnitude, the portion of the overall second magnetic field generated by each of the peripheral coils 204 is approximately one fourth.

Figure 3:
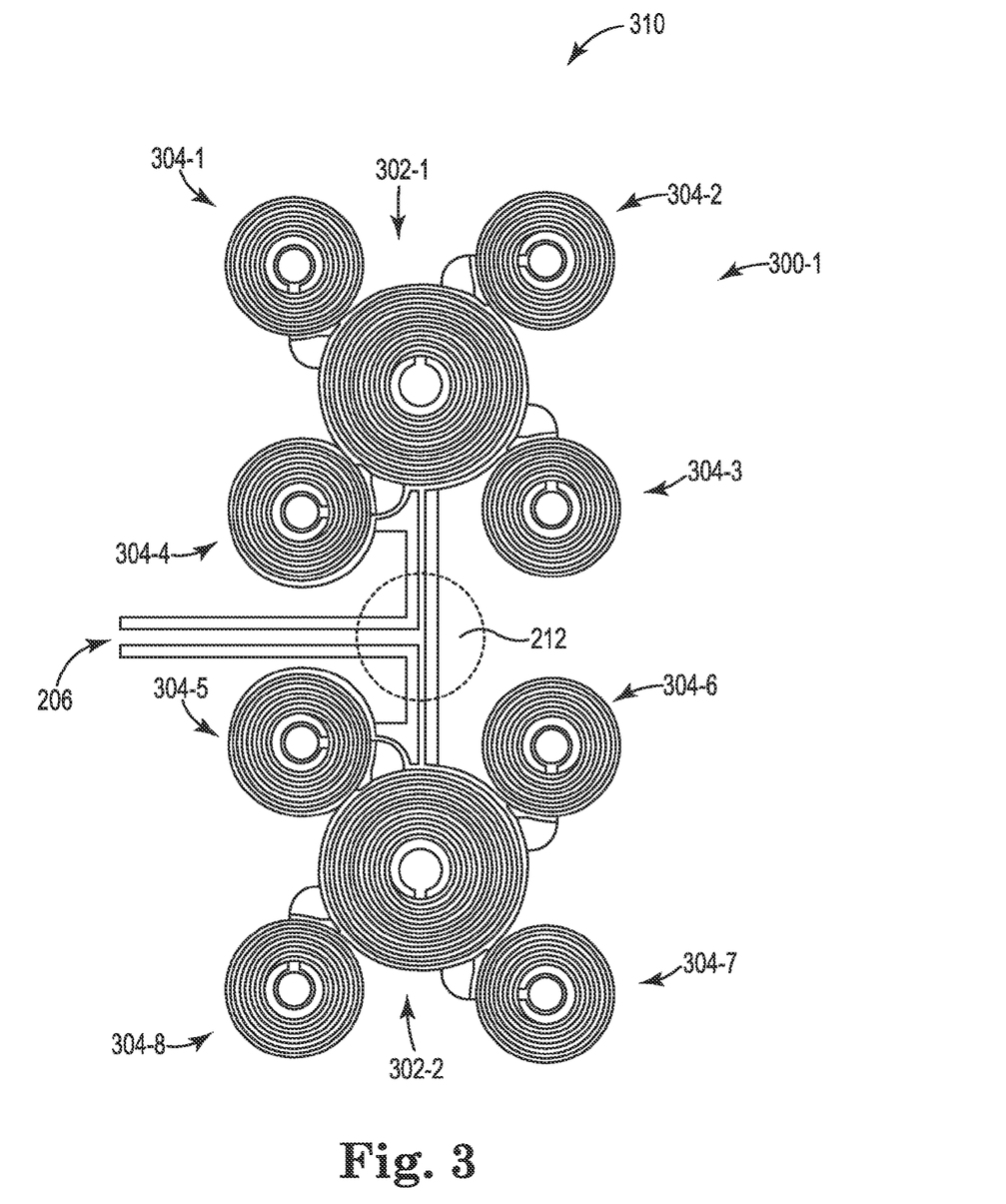
FIG. 3 illustrates a top view of electromagnets that can be integrated into an ion trap for trapping ions with integrated electromagnets in accordance with one or more embodiments of the present disclosure.

FIG. 3 illustrates a top view of electromagnets that can be integrated into an ion trap for trapping ions with integrated electromagnets in accordance with one or more embodiments of the present disclosure. The electromagnets illustrated in FIG. 3 may be herein referred to as "system 310." System 310 includes two devices analogous to the device 200 previously discussed in connection with FIG. 2A. A first device 300-1 includes a first medial coil 302-1, a first peripheral coil 304-1, a second peripheral coil 304-2, a third peripheral coil 304-3, and a fourth peripheral coil 304-3. A second device 300-2 includes a second medial coil 302-2, a fifth peripheral coil 304-5, a sixth peripheral coil 304-6, a seventh peripheral coil 304-7, and an eighth peripheral coil 304-8.

The system 310 can include an input/output (I/O) portion 306, which can connect one or more portions of the system 310 to one or more current sources (or other device(s)), for instance. In some embodiments, the I/O portion 306 can connect the system 310 to a controller and/or computing device, for instance, configured to control one or more operations of the system 310.

The first medial coil 302-1 can generate a first upward magnetic field, for instance. The four first peripheral coils (coils 304-1 to 304-4) can be positioned to surround the first medial coil 302-1 and can be configured to generate a first downward magnetic field. The second medial coil 302-2 can be located a particular distance from the first medial coil 302-1 and can be configured to generate a second upward magnetic field. In some embodiments, the distance can be approximately 60 nanometers from center to center (e.g., between 55 nanometers and 65 nanometers). The four second peripheral coils (coils 304-5 to 304-8) can be positioned to surround the second medial coil 302-2 and can be configured to generate a second downward magnetic field.

Between the first medial coil 302-1 and the second medial coil 302-1 can be a logic area 312. In some embodiments the logic area 312 can be a space defined by the first medial coil 302-1, the second medial coil 302-2, two of the four first peripheral coils (e.g., peripheral coils 304-4 and 304-3) and two of the four second peripheral coils (e.g., peripheral coils 304-5 and 304-6). Various logic functions can be performed in the logic area 312. For example, a magnetic field gradient can be created between two ions trapped in the logic area, which may allow an opportunity to create separation between the ions. If it is desirable to expose one of the ions to a laser light beam but not the other, a magnetic field gradient can provide the means to sufficiently separate. One example includes a location where laser-caused cooling of ions (e.g., strontium 86) occurs.

In some embodiments, the logic area can be used to "shelve" one or more ions. Shelving can include controlling and/or isolating ionic spin, for instance. Shelving can include keeping ion location static for a period of time (e.g., hundreds of microseconds). In some embodiments, sending approximately 100 megahertz signals though the coils 302 and/or 304 can provide proper magnetic field conditions for shelving.

Additionally, the system 310 can be located at a particular place in an ion trap in order to provide local compensating fields for undesirable inhomogeneities in a global magnetic field (e.g., a field created by a plurality of Helmholtz coils).

Figure 4:
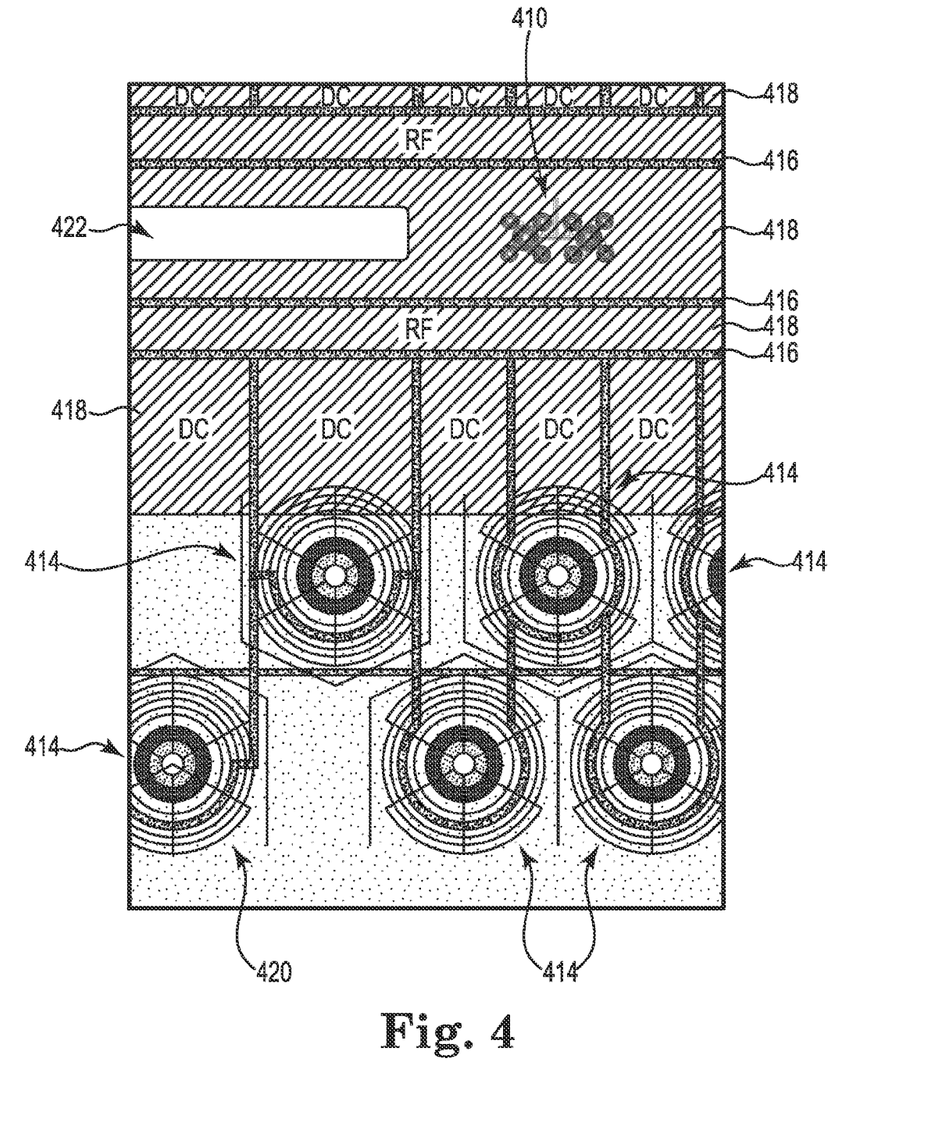
FIG. 4 illustrates a top detailed view of a portion of the ion trap illustrated in FIG. 1 in accordance with one or more embodiments of the present disclosure.

FIG. 4 illustrates a top detailed view of a portion of the ion trap 113 for trapping ions with integrated electromagnets illustrated in FIG. 3 in accordance with one or more embodiments of the present disclosure. As shown, the portion of the ion trap includes a first conductive material 416, a second conductive material 418, and a third conductive material 420. The first conductive material 416 can form a ground plane; the second conductive material 418 can form a signal routing plane, and the third conductive material 420 can form a ground and/or DC electrode rail plane.

As shown in FIG. 4, the ion trap can include a plurality of e.g., DC electrodes 414 for ion trapping. Each of the electrodes 414 can include a TSV and a trench capacitor. While some portion of the devices 414 would otherwise be underneath, and thus obscured by, the third conductive material 420, the devices 414 are shown in FIG. 4 for purposes of illustration. It is again noted that the positioning and/or layout of the devices shown in FIG. 4 is not to be taken in a limiting sense; that is, embodiments of the present disclosure are not limited to the positioning and/or layout of the devices 414 shown in FIG. 4.

As previously discussed, one or more ions can pass from a bottom of the ion trap to a top of the ion trap through a loading slot 422. The loading slot 422 can be located on the ground plane of the ion trap, for instance, and can be substantially centered on a longitudinal axis of the ion trap. Once an ion passes above the top surface of the ground plane, the ion can be trapped in a potential well using electrical and/or magnetic fields created by the devices 414.

As shown in FIG. 4, the ion trap includes an electromagnet system 410. The system 410 can be analogous to the systems 110 and/or 310, respectively discussed in connection with FIGS. 1 and 3, for instance. The system 410 can be integrated (e.g., embedded) in the first conductive material 416 and the second conductive material 418. That is, the second layer portion of the system 410 (illustrated in part in FIG. 2C) can be included in the second conductive material 418 layer. The first layer portion of the system 410 (illustrated in part in FIG. 2B) can be included in the first conductive material layer 416 below the second conductive material 418. One or more vias can extend from the first conductive material 416 to the second conductive material 418, connecting the first layer portion and the second layer portion.

Figure 5:
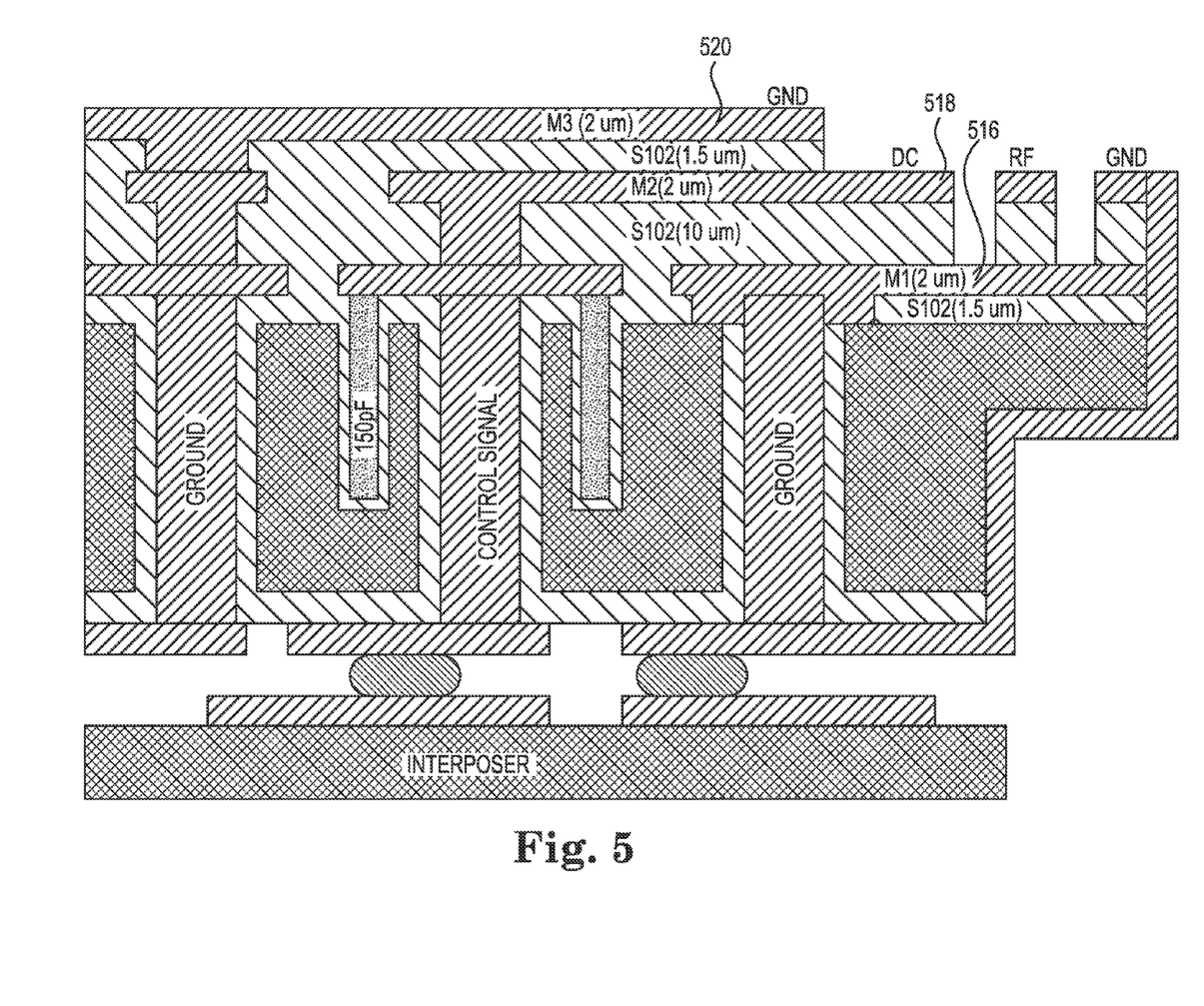
FIG. 5 illustrates a cross-sectional view of a portion of an ion trap for trapping ions with integrated electromagnets in accordance with one or more embodiments of the present disclosure.

FIG. 5 illustrates a cross-sectional view of a portion of an ion trap for ion trapping with integrated electromagnets in accordance with one or more embodiments of the present disclosure. As shown, the ion trap includes a plurality of (e.g., 3) planar conductive materials: a first conductive material 516, a second conductive material 518, and a third conductive material 520. Each of the conductive materials 516, 518, and 520 can be separated by a dielectric material (e.g., silicon dioxide). In some embodiments, the conductive materials 516, 518, and 520 can be gold. Each of the conductive materials 516, 518, and 520 can be formed to approximately 1.5 microns thick. The first conductive material 516 can form a ground plane; the second conductive material 518 can form a signal routing plane; and the third conductive material 520 can form a ground and/or DC electrode rail plane.

The electromagnet system (not shown in FIG. 5) can be integrated (e.g., embedded) in the first conductive material 516 and the second conductive material 518. That is, the second layer portion of the system (illustrated in part in FIG. 2C) can be included in the second conductive material 518. The first layer portion of the system (illustrated in part in FIG. 2B) can be included in the first conductive material 516 below the second conductive material 518. One or more vias can extend from the first conductive material 516 through the dielectric material to the second conductive material 518, connecting the first layer portion and the second layer portion.

FIG. 6 illustrates a method 622 for ion trapping with integrated electromagnets in accordance with one or more embodiments of the present disclosure. The method 622 can be performed by a computing device (e.g., via a processor executing instructions stored on a non-transitory computer-readable medium) and/or by a controller having logic to perform the method 622.

At block 624, method 622 includes generating a uniform magnetic field using a plurality of Helmholtz coils. Helmholtz coils can be used to create a region of substantially uniform magnetic field (e.g., 0.02 T, approximately 200 Gauss). The Helmholtz coils can allow for the creation of a nearly-uniform magnetic field across the entire surface (e.g., top surface) of the ion trap. The Helmholtz coils can be large (e.g., 2 meter) diameter coils and can be external to a vacuum system encasing the ion trap. In some embodiments, a set of nested mu-metal and copper boxes surrounding the Helmholtz coils can be approximately 6×6×6 meters.

At block 626, method 622 includes generating a first local upward magnetic field using a first medial coil. In accordance with one or more embodiments of the present disclosure, the first medial coil can be configured to generate a first magnetic field. Several tens of milliamps can flow through the first medial coil (e.g., from an I/O portion, previously discussed), creating a magnetic field of up to 0.02 T, with field gradients of up to 20 T/m.

At block 628, method 622 includes generating four first local downward magnetic fields using four first peripheral coils positioned to surround the first medial coil. In accordance with one or more embodiments of the present disclosure, the four first peripheral coils can be configured to generate downward magnetic fields. Several tens of milliamps can flow through the each of the peripheral coils 104, creating a magnetic field of up to 0.02 T, with field gradients of up to 20 T/m.

At block 630, method 622 includes generating a second local upward magnetic field using a second medial coil located a particular distance from the first medial coil. As previously discussed, such a distance can be approximately 60 nm, for instance.

At block 632, method 622 includes generating four second local downward magnetic fields using four second peripheral coils positioned to surround the second medial coil. In accordance with one or more embodiments of the present disclosure, the four second peripheral coils can be configured to generate downward magnetic fields. Several tens of milliamps can flow through the each of the peripheral coils, creating a magnetic field of up to 0.02 T, with field gradients of up to 20 T/m.

At block 634, method 622 includes trapping an ion in a space defined by the first medial coil, the second medial coil, two of the four first peripheral coils and two of the four second peripheral coils. The space between the first medial coil and the second medial coil can be termed a logic area. Various logic functions can be performed in the logic area, such as those previously discussed in connection with FIG. 3, for instance.

Although specific embodiments have been illustrated and described herein, those of ordinary skill in the art will appreciate that any arrangement calculated to achieve the same techniques can be substituted for the specific embodiments shown. This disclosure is intended to cover any and all adaptations or variations of various embodiments of the disclosure.

It is to be understood that the above description has been made in an illustrative fashion, and not a restrictive one. Combination of the above embodiments, and other embodiments not specifically described herein will be apparent to those of skill in the art upon reviewing the above description.

The scope of the various embodiments of the disclosure includes any other applications in which the above structures and methods are used. Therefore, the scope of various embodiments of the disclosure should be determined with reference to the appended claims, along with the full range of equivalents to which such claims are entitled.

In the foregoing Detailed Description, various features are grouped together in example embodiments illustrated in the figures for the purpose of streamlining the disclosure. This method of disclosure is not to be interpreted as reflecting an intention that the embodiments of the disclosure require more features than are expressly recited in each claim.

Rather, as the following claims reflect, inventive subject matter lies in less than all features of a single disclosed embodiment. Thus, the following claims are hereby incorporated into the Detailed Description, with each claim standing on its own as a separate embodiment.

What is claimed:

1. A device for ion trapping, comprising:
   a plurality of electrodes configured to trap an ion above a surface of the device;
   a medial coil below the surface of the device; and
   a plurality of peripheral coils below the surface of the device, each positioned at a respective radial angle associated with the medial coil;
   wherein the medial coil is configured to generate a first magnetic field having a first orientation, and wherein the peripheral coils are configured to generate a second magnetic field having a second orientation that opposes the first orientation.

2. The device of claim 1, wherein the plurality of peripheral coils includes four peripheral coils.

3. The device of claim 1, wherein the plurality of peripheral coils are equally distanced from each other.

4. The device of claim 1, wherein the plurality of peripheral coils are each equally distanced from the medial coil.

5. The device of claim 1, wherein the medial coil includes:
   a first layer portion disposed in a first layer of the device;
   a second layer portion disposed in a second layer of the device; and
   a via connecting the first layer portion and the second layer portion.

6. The device of claim 5, wherein each of the peripheral coils includes:
a first layer portion disposed in the first layer of the device;
a second layer portion in a second layer of the device; and
a via connecting the first layer portion and the second layer portion.

7. The device of claim 1, wherein the medial coil and the plurality of peripheral coils include a wire composed of at least one of copper and gold.

8. The device of claim 7, wherein a thickness of the wire is between 0.68 and 0.72 microns.

9. The device of claim 7, wherein a net magnetic flux density at a distance of 300 microns from a center of the medial coil does not exceed 1E-6 Tesla.

10. A system, comprising:
a first medial coil configured to generate a first upward magnetic field;
four first peripheral coils positioned to surround the first medial coil and configured to generate a first downward magnetic field;
a second medial coil located a particular distance from the first medial coil and configured to generate a second upward magnetic field; and
four second peripheral coils positioned to surround the second medial coil and configured to generate a second downward magnetic field.

11. The system of claim 10, wherein each of the four first and four second peripheral coils is configured to generate the downward magnetic field with a strength approximately one-fourth a strength of the upward magnetic field generated by either the first medial coil or the second medial coil.

12. The system of claim 10, wherein the downward magnetic field and the upward magnetic field have substantially equivalent magnitudes.

13. The system of claim 10, wherein the distance between the first medial coil and the second medial coil defines a portion of a logic area.

14. The system of claim 10, wherein each of the first and second medial coil and the four first and four second peripheral coils have a radius between 15 and 50 microns and can contain between 60 and 70 windings.

15. The system of claim 10, wherein the system is substantially centered on a longitudinal axis of an ion trap.

16. A method for ion trapping, comprising
generating a uniform magnetic field using a plurality of Helmholtz coils;
generating a first local upward magnetic field using a first medial coil;
generating four first local downward magnetic fields using four first peripheral coils positioned to surround the first medial coil;
generating a second local upward magnetic field using a second medial coil located a particular distance from the first medial coil;
generating four second local downward magnetic fields using four second peripheral coils positioned to surround the second medial coil; and
trapping an ion in a space defined by the first medial coil, the second medial coil, two of the four first peripheral coils and two of the four second peripheral coils.

17. The method of claim 16, wherein trapping the ion includes controlling a spin direction of the ion.

18. The method of claim 16, wherein the space is associated with at least one laser that causes ion cooling.

19. The method of claim 16, wherein the method includes creating a magnetic field gradient in the space.

20. The method of claim 16, wherein the method includes shelving the ion in the space for a period of time.

* * * * *